United States Patent [19]

Havas et al.

[11] 4,035,276

[45] July 12, 1977

[54] MAKING COPLANAR LAYERS OF THIN FILMS

[75] Inventors: Janos Havas, Hopewell Junction; John S. Lechaton, Wappingers Falls; Joseph Skinner Logan, Poughkeepsie, all of N.Y.

[73] Assignee: IBM Corporation, Armonk, N.Y.

[21] Appl. No.: 681,380

[22] Filed: Apr. 29, 1976

[51] Int. Cl.² .......................................... C23C 15/00
[52] U.S. Cl. ........................ 204/192 EC; 156/656; 204/192 E
[58] Field of Search ............ 204/192 EC; 156/3, 7, 156/8, 17, 656

[56] References Cited

U.S. PATENT DOCUMENTS

| 3,661,761 | 5/1972 | Koenig | 204/298 |
|---|---|---|---|
| 3,804,738 | 4/1974 | Lechaton et al. | 204/192 |
| 3,873,361 | 3/1975 | Franco et al. | 204/192 X |
| 3,976,524 | 8/1976 | Feng | 156/8 |

OTHER PUBLICATIONS

R. E. Jones et al. "Re–emission Coefficients of Si and SiO₂ Films Deposited Through RF and DC Sputtering," J. Appl. Phys., vol. 38, Nov. 1967, pp. 4656–4662.

L. Maissel et al. "Re–emission of Sputtered SiO₂ During Growth and its Relation to Film Quality," IBM J. Res. Dev., vol. 14, Mar. 1970.

O. Bilous et al., "Multilevel Wiring for Integrated Circuits," IBM Tech. Disclosure Bull., vol. 13, No. 2, July 1970, pp. 429–430.

*Primary Examiner*—John H. Mack
*Assistant Examiner*—Aaron Weisstuch
*Attorney, Agent, or Firm*—Thomas F. Galvin

[57] ABSTRACT

A method for forming coplanar thin films, particularly conductor-insulator patterns, on a substrate. A pattern which includes a first thin film and an expendable material deposited thereon is formed on the substrate. The expendable material is selected so that it can be selectively removed by an etchant which does not attack the first thin film or an insulator which is to be deposited. The second thin film is deposited by RF sputtering at a bias which is sufficiently high to cause substantial reemission of the second film. This results in the covering of the exposed substrate surfaces and the upper surface of the material with the second film but leaving the side surfaces of the material exposed. The expendable material is then chemically etched so as to lift-off both the material and the second film deposited thereon, thereby leaving a coplanar pattern of first and second thin films.

In the preferred embodiment, the first thin film is a conductor and the RF sputtered second thin film is an insulator such as glass. Alternatively, the first thin film could be the insulator with the RF sputtered second film being the conductor, or both thin films could be dissimilar metals or insulators. Via hole studs, or feedthroughs, which are metallic interconnections between a first level conductive pattern (metallization) and a second level conductive pattern, may be formed by repeating substantially the same steps atop the first conductive pattern at desired locations. As many substantially coplanar levels as desired may be formed without the need for etching the second thin film.

21 Claims, 17 Drawing Figures

MAKING COPLANAR LAYERS OF THIN FILMS

CROSS-REFERENCE TO A RELATED APPLICATION

This application is related to copending application of Feng et al, Ser. No. 681,367, Filed Apr. 29, 1976 and assigned to the assignee of the present invention.

BACKGROUND OF THE INVENTION

1. Field of the Invention

This invention relates to the deposition of coplanar thin films atop substrates. In particular, it relates to a method for forming a conductive pattern which is coplanar with its adjacent insulator. When applied to multiple levels the method thereby eliminates rough or uneven surfaces at the upper levels of multi-level structures.

2. Description of the Prior Art

The introduction of a process for depositing planar glass atop metallic stripes or thin films on substrates has made it possible to adequately insulate the stripes as well as avoiding steps, bumps, or depressions in the glass covering the stripes. Such a process is described in copending application of Auyang et al., Ser. No. 512,781 filed Dec. 31, 1970, now U.S. Pat. No. 3,983,022. The application is assigned to the assignee of the present invention. Such complete planarization of insulating layers is particularly desirable in structures having several layers of metallurgy separated by several levels of insulation material. The cumulative effects of several levels of raised metallization on succeeding insulating layers is progressively more pronounced and undesirable.

Although the basic resputtering process of Auyang et al., has been successful, it has not led to satisfactory planarized, multi-level metallurgies. In the first place, the degree of planarity achievable in the basic planarization process depends on the width of the metallic stripes. The complete planarization of an insulating layer deposited over a metallic stripe of conventional width, from 300 to 1500 microinches, may take as much as 24 hours. This is an inordinate amount of time. In addition, there may be wide variations between the widths of the various lines and stripes on the substrate which introduce a time factor making complete planarization impractical.

Another, perhaps more significant, problem in attempting to form multi-levels of metallization with the basic planarization process is the necessity for forming via connections through the insulating layer covering each metallic level. At present, via holes are generally etched in the insulating layer; and a subsequent level of metallization is selectively deposited through the via holes to interconnect with the lower level.

However, etching of the insulator, no matter how controlled the process, tends to result in shorts and pinholes between levels. This requires a thicker insulation layer than would be expected.

In addition, the dielectric etching process materially restricts the density of the metallic stripes unless different types of dielectric materials are used for contiguous levels. It is ordinarily necessary to provide for the possibility of locating two via holes in adjacent parallel lines in side-by-side relation on the substrate. Photolithographic and masking technology requires that the diameter of a via hole at the top of the dielectric or insulating surface be at least 0.25 mils. A conventional pad which interconnects levels of metallurgy must overlap the via hole by at least 0.15 mils or else a sharp-pointed, upperly-extended lip occurs about the via hole which is detrimental to mask life. It is also difficult to deposit a layer of metal or glass over the pad. This requires that the pads have a diameter of 0.55 mils. Because adjacent pads must be located at least 0.2 mils apart, the minimum center-to-center spacing between two parallel, adjacent conductive stripes is of the order of 0.75 mils. In an ideal structure, i.e., one which did not require pads over the via holes, the stripes could be spaced at 0.5 mils center-to-center distance.

Still another problem encountered in present-day manufacturing is the practical impossibility of making one feedthrough, or via stud, connection directly atop another. In fact, the fabrication of coincident feedsthroughs is rarely, if ever, attempted even though some wiring designs would benefit thereby.

The difficulty lies with the extremely non-planar topography of the metal deposited in the coincident via holes. This results in very thin metal sidewalls, metal spike formations and photoresist coverage problems. The thin sidewalls pose severe electric problems because of the extremely high current densities in these regions.

SUMMARY OF THE INVENTION

Accordingly, it is a primary object of our invention to provide a practical technique for forming one or more substantially coplanar, thin film patterns atop a substrate.

It is another object of our invention to reduce the number of inter-level shorts and pinholes in a multi-level wiring structure.

It is another object of our invention to eliminate problems caused by the non-planarity of metal deposited in coincident via holes in multi-level wiring structures.

It is another object of our invention to make the thickness of the insulating layers independent of the underlying conductive patterns in such structures.

These and other objects of our invention are achieved by forming a pattern on a substrate which includes a first thin film, which may comprise a set of connected or disconnected patterns of varying geometrical designs, and an expendable material. The latter is selected so that it can be removed by an etchant which does not attack the first thin film or a second thin film which is to be deposited.

The second thin film is then deposited by RF sputtering at a bias which is sufficiently high to cause substantial reemission of the second film. This results in the covering of the exposed substrate surfaces as well as the expendable material by the second film, but leaving exposed the side surfaces of the expendable material. The latter is then etched so as to remove both the expendable material as well as the second film deposited thereon. A substantially coplanar first thin film pattern and complementary second thin film pattern remains.

The initial pattern is preferably formed by a lift-off process such as that described in the patent to Franco et al., entitled "Method of Depositing Thin Film Using a Lift-Off Mask", U.S. Pat. No. 3,873,361 and assigned to the assignee of the present invention.

In one preferred embodiment the first thin film may be aluminum, copper-doped aluminum or copper-doped aluminum with silicon added. The expendable material is preferably copper or chrome or a composite of chrome-copper-chrome. The second thin film is an insulator which is preferably silicon dioxide.

Via connection studs, or feedthroughs, between a first-level conductive pattern and a second-level conductive pattern to be deposited in later steps may be formed by much the same process. The via studs are formed atop selected areas of the first conductive pattern by depositing a metal, preferably aluminum, and a second material, preferably chrome-copper-chrome as a cap. A second insulator is then deposited atop the first insulator and the removable material by RF sputtering at a bias which is sufficiently high to cause substantial reemission of the insulator. As in the first process, the exposed substrate surfaces and the second material are covered but the side surfaces of the second material remain exposed. The expendable material is then chemically etched so as to lift-off both the material and the insulator deposited thereon, thereby leaving the studs connected to the first conductive pattern and a second insulator layer covering the first pattern where no studs are formed. The stud-insulator layer is also substantially coplanar.

The same basic process may be continued for second and other levels of conductive patterns.

DESCRIPTION OF THE PREFERRED EMBODIMENT

Although our invention is primarily directed at forming conductive patterns atop semiconductor substrates, its application extends to other types of thin films. In particular, our invention is relevant to any application contemplating a thin film pattern and a complementary thin film pattern lying in the same plane, e.g., thin films of dissimilar metals or dielectrics.

Figure 1A:
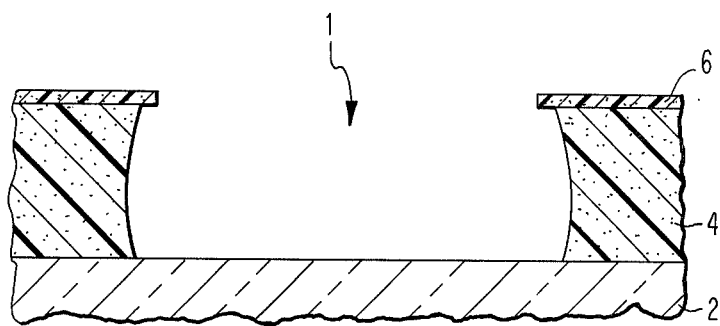
FIGS. 1A-1K are diagrammatic, cross-sectional views of a structure being fabricated in accordance with the preferred embodiment of our invention.
Figure 1B:
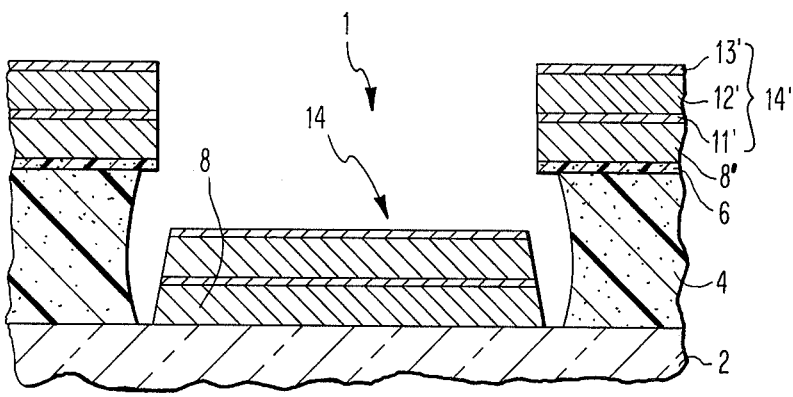
Figure 1C:
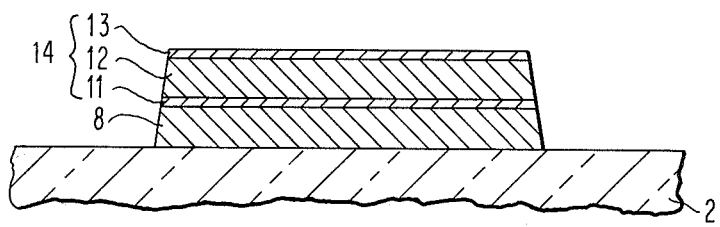

FIGS. 1A to 1C illustrate the formation of a composite of a conductive pattern and an identical pattern of an expendable material; the latter is removed in a later step by a lift-off process.

Our preferred lift-off process is that described in the copending application of J.R. Franco et al., Ser. No. 576,054, filed May 9, 1975 and entitled "A Method For Forming Patterned Films Utilizing a Transparent Lift-Off Mask" now U.S. Pat. No. 4,004,044. This method comprises the deposition of a first organic polymeric masking layer 4 on substrate 2 which is then baked to improve adhesion and thermal stability. A polydimethylsiloxane resin layer 6 having a preponderence of SI—O bonds relative to SI—CH₃ bonds is spun-on over polymeric layer 4. A second masking layer, not shown, which may be a photoresist layer or an electron-beam resist layer, is placed on resin layer 4. The second masking layer is patterned using standard photo- or electron-beam lithographic techniques to expose portions of the resin layer in the desired pattern. Using the patterned second masking layer as a mask, openings are reactively sputter-etched in the resin layer using a fluorine gas ambient. Then, conforming openings 1 are made in the first masking layer by a second reactive-sputter-etching step in the same sputtering chamber using an oxygen gas ambient instead of the fluorine gas ambient. In the standard lift-off process, a thin metallic film is then blanket-deposited atop the resin and into openings 1 in the first masking layer. This layer is then removed, causing that portion of the thin film atop the resin to be lifted off. Overetching of the first masking layer 4 produces an overhang of the openings in the overlying polydimethylsiloxane resist layer 6 which facilitates easy lift-off of the unwanted portions of the finally-deposited thin films.

In our preferred embodiment, substrate 2 is typically an insulator such as silicon dioxide, silicon nitride, or a composite of silicon dioxide and silicon nitride. In the usual process the substrate is disposed atop a silicon semiconductor substrate (not shown). Openings, not illustrated, are provided, to connect regions in an underlying semiconductor layer to the conductive patterns formed on the surface of the insulating substrate 2. For purposes of clarity and conciseness FIGS. 1A-1K, which illustrate the preferred embodiment of the process, omit illustration of the silicon semiconductor as well as the contact openings in insulating layer 2.

In FIG. 1B, utilizing the lift-off composite structure of FIG. 1A, a functional metallic film 8' and an expendable working metallic film or cap 14', is blanket-deposited over the structure. Those portions of the films which are deposited within opening 1 are denoted by the numerals 8 and 14. The functional film may be any metal conventionally used for integrated circuit metallization, e.g., aluminum, aluminum-copper alloys, aluminum-copper-silicon, etc.. Film 8 is deposited in a conventional manner having a thickness in the order of 1 to 2.5 micrometers. The expendable working film 14 is, in fact, three distinct layers of metal in the preferred embodiment, although a single metal would also suffice. The important point is that the working film or cap be removable by an etchant which does not attack functional metal 8 or the glass to be deposited. In the preferred embodiment, the expendable, working metal is a composite of chrome 11, copper 12 and chrome 13. The etchant is concentrated nitric acid. Chrome layer 11, which is typically deposited to a thickness of around 500 angstroms acts as a barrier to the alloying of the copper and aluminum. Chrome layer 13, which is also around 500A thick, acts to protect the copper from attacks by the solvent which removes photoresist layer 4.

Besides the particular metals discussed, a composite of chrome-silver-chrome or tantalum-gold-tantalum could be used in place of aluminum 8, with aluminum acting as the working metal rather than chrome-copper-chrome cap 14. The etchant may then be potassium hydroxide solution.

Metal is selected as the expendable material because the RF sputtering temperatures are conventionally 350° C or more. However, high temperature organic materials as well as dielectric materials could also be used. Throughout the specification, for purposes of clarity and conciseness, the lower conductive pattern 8 is termed "functional metal" and the expendable material 14 are termed "working metal" or "cap". Broadly expressed however, layer 8 may be any thin film material and layer 14 is a material which may be removed without substantially affecting first thin film 8 or the second thin film which is to be deposited.

One technique for depositing the composite thin films 8 and 14 on substrate 2 uses the method described in U.S. Pat. No. 3,873,361 entitled "Method of Depositing Thin Film Utilizing A Lift-Off Mask" in the names of Franco et al., and assigned to the assignee of the present invention. Other techniques could be used as well. For example, the technique described in the applications of Franco et al., Ser. No. 576,054 filed May 9, 1975, now U.S. Pat. No. 4,004,044 or the technique described in application Ser. No. 448,327 filed Mar. 5, 1974 in the names of Feng et al., entitled "A Lift-Off Method Of Fabricating Thin Films In A Structure Utilizable As A Lift-Off Mask" now U.S. Pat. No. 3,982,943 could be used. Each of these applications is assigned to the assignee of the present invention.

Returning to FIG. 1C, utilizing conventional lift-off removal techniques, photoresist layer 4 is completely removed by immersion for about 15-30 minutes in a solvent such as N-methyl pyrrolidone standard photoresist solvent. As more completely described in the above reference copending application of Franco et al., Ser. No. 576,054, the solvent selected is one which dissolves or swells the polymeric material of layer 4 without affecting the thin films. Such solvents also include acetone, isopropanol, methyl ethyl ketone or trichloroethylene. This step results in the structure shown in FIG. 1C, which is a composite of functional metal 8 and the working metal 14 on substrate 2.

Other, less desirable, techniques could be used to arrive at the structure of FIG. 1C. In addition to lift-off techniques, standard reactive ion etching or sputter etching techniques might also be used, although they are less feasible at the present time. Such techniques generally comprise depositing blanket layers of the working and functional metals atop the substrate, applying an appropriate photoresist, developing the photoresist as a mask and removing the metal by reactive ion etching or sputter etching where the photoresist has been removed.

Figure 1D:
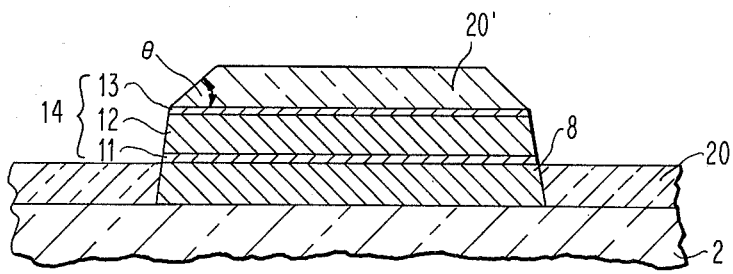

FIG. 1D illustrates a critical step in our process. Insulator 20 is deposited in blanket fashion atop substrate 2 and metal layer 13. The insulator, which is preferably glass, is deposited by RF sputtering at a bias which is sufficiently high to cause substantial reemission of insulator 20. As shown in FIG. 1D, this results in the covering of the surfaces of the exposed substrate and cap 14, but leaving the side surfaces of cap 14 uncovered. The RF sputtering apparatus used to accomplish this is well known in the art and has been described in the publication "Power Networks For Substrates," R.P. Auyang et al., IBM Technical Disclosure Bulletin, September 1971, page 1032. The system has also been described in the patent issued in the name of J.F. Lechaton et al., U.S. Pat. No. 3,804,728 which is assigned to the assignee of the present application.

Using this type of RF sputtering system, we have deposited glass having the configuration illustrated in FIG. 1D by supplying a total power of 3000 watts to the RF sputtering system. The anode, on which the substrate is disposed, receives a power input of 500 watts; and the target electrode of silicon dioxide material to be deposited receives an input power of 2,500 watts. We have found that the sides of cap 14 are kept clear when the angle $\theta$ of the side surfaces of 20' to the horizontal is 31° or less. The reemission co-efficient of the sputtered material during the deposition process is typically around 0.60.

The importance of maintaining the sides of the working material 14 free of glass cannot be overemphasized. Our process is ineffective if there is any significant quantity of glass adhering to the sides.

However, if a small amount of glass did remain on the side surfaces of material 14, it could be removed by a dip into buffered HF etch for a short period. This would be sufficient to clean the side surfaces but would not significantly affect layer 20.

Figure 1E:
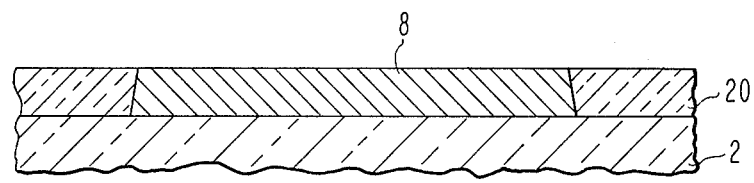

In FIG. 1E the first level of metal and glass is shown after the working material 14 is removed. The etchant used to remove the chrome-copper-chrome cap 14 is preferably concentrated nitric acid, which does not substantially attack either aluminum 8 or glass 20. In practice, the planar glass-metal structure is extremely smooth, being substantially without any steps or roughness often associated with other metallization processes. Scanning electron microscope examination of the structure has confirmed this.

Figure 1F:
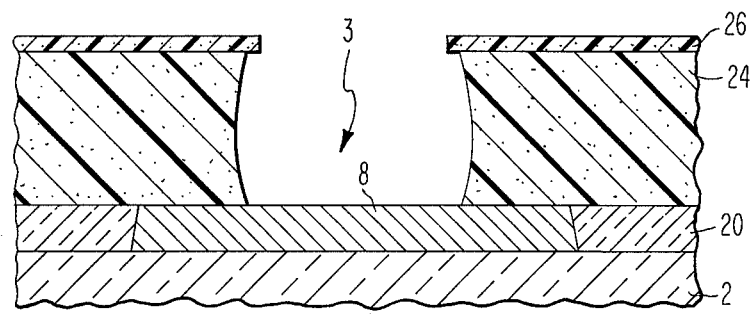

Although our process is useful for forming a single level of coplanar conductor and glass patterns, it is most advantageous in forming multi-level structures. In particular, the formation of via studs or feedthroughs between levels of metallization can also be performed using the same basic steps. The formation of a typical feedthrough is illustrated in FIG. 1F to 1J. In FIG. 1F the lift-off process previously described with particular reference to the Franco et al. patent application Ser. No. 576,054 is begun. An opening 3 for a via stud in the composite photoresist-resin layer 24/26 is made over the first level conductive pattern 8. Opening 3 is illustrated as encompassing less than the full width of metal stripe 8. As will be explained in a later section of this specification, our process is not constrained in this manner. In fact, the process lends itself to making studs of widths equal to, or greater than, the stripe. This is a significant advantage in forming wiring layers atop semi-conductor structures.

Figure 1G:
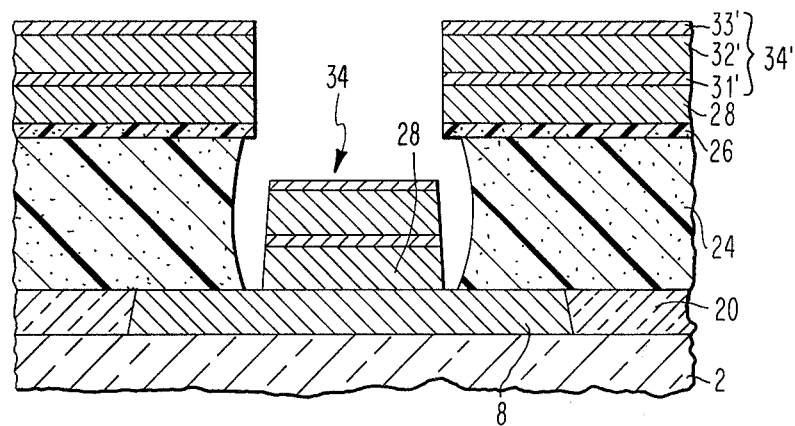
Figure 1H:
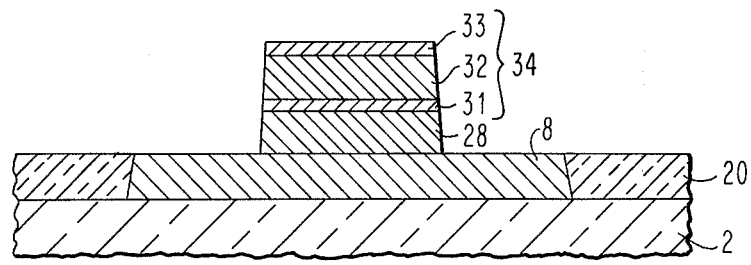

In FIG. 1G functional metal 28 and composite working metal 34 are deposited in the same fashion as previously described with respect to layers 8 and 14. The preferred embodiment contemplates also the use of aluminum as the functional metal and chrome-copper-chrome composite as the working metal. After the deposition, photoresist layer 24 is removed, thereby leaving a stud consisting of functional metal 28 and the working metal 34 as shown in FIG. 1H.

Figure 1I:
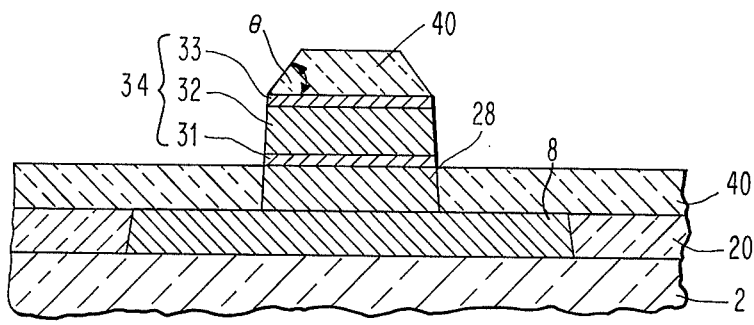

Glass 40 is then deposited by RF sputtering at a bias which is sufficiently high to cause substantial reemission of the glass. Angle $\theta$ is 31° or less. As shown in FIG. 1I, this sputtering process results in the covering of the exposed surfaces of cap 34 and glass layer 20. However, the side surfaces of cap 34 are left completely exposed.

Figure 1J:
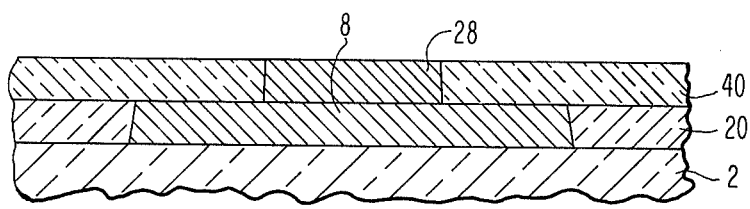

As shown in FIG. 1J the process for forming the feedthrough stud is completed by lifting-off cap 34. As indicated previously, to remove a chrome-copper-chrome composite cap concentrated nitric acid is suitable.

Figure 1K:
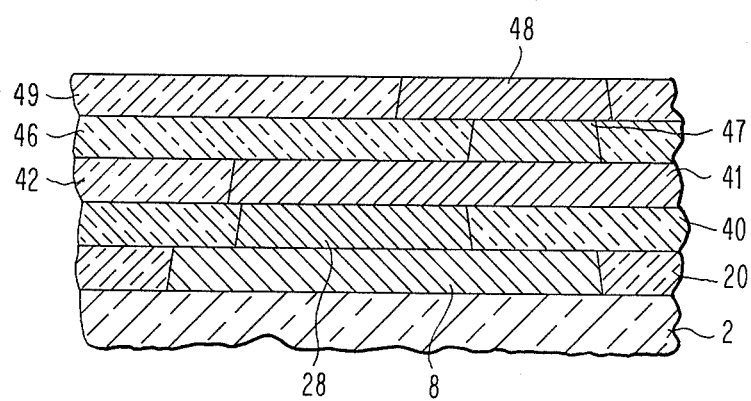

FIG. 1K illustrates a five level conductive film structure formed atop a substrate and using the same process steps to achieve each of three levels of metallization as well as the feedthroughs between levels. Thus, metallization 8, 41 and 48 are conductive patterns formed in three levels and interconnected by feedthroughs 28 and 47.

One advantage of our process is the relative independence of the thickness of the insulating layer, say layer 46, to the thickness of the underlying metallization 41. Bumps, crevices and spikes in standard structures are regions which are difficult to cover. However, when non-planarity of layers is reduced, less overlying glass is required to assure adequate insulation between metallization layers.

Figure 2:
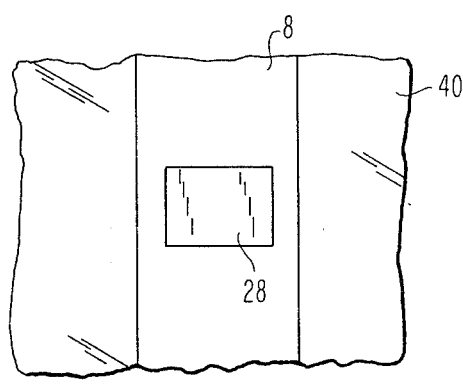
FIGS. 2-5 are top surface views of some types of feedthroughs made practical with our invention.

Another principal advantage of this technique is that feedthroughs of various geometrical design with respect to the underlying and overlying metallization may be fabricated. Some of the structures are illustrated in FIGS. 2–5 which are top surface views of feedthrough studs. FIG. 2 illustrates a feedthrough 28 disposed atop a metallic line 8 on a substrate 40. The width of feedthrough 28 is less than the width of line 8. This is the configuration most often used in present day semiconductor processing and is the one illustrated in FIGS. 1A through 1K.

Figure 3:
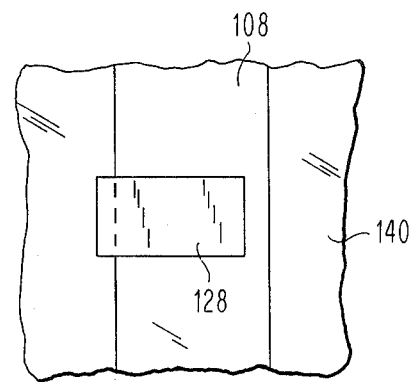

In FIG. 3 feedthrough 128 is slightly misaligned with respect to conductive stripe 108. In ordinary circumstances this would represent a substantial misalignment, resulting in etching of glass layer 140 at undesired locations. Such overetching quite often results in shorts between metallization layers. However, in the present process such misalignment would be acceptable because no etching of the insulation layers takes place.

Figure 4:
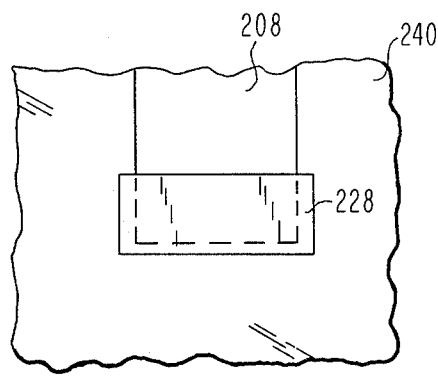
Figure 5:
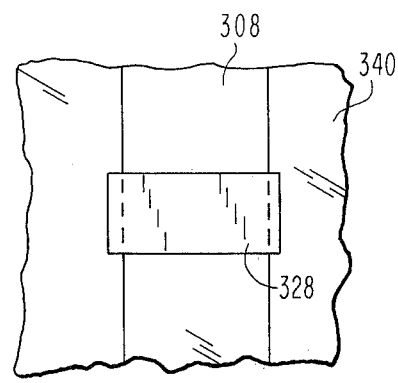

FIGS. 4 and 5 illustrate structures wherein the widths of the feedthroughs are larger than the widths of the conductive lines to which they make contact. Thus, in FIG. 4 stud 228 is disposed atop conductive stripe 208. Stud 228 completely overlaps the three sides of stripe 208 and also contacts the surface of dielectric layer 240. A significant advantage of the type of structure shown in FIGS. 4 and 5 is that mask misalignment, which would be significant in prior art methods, poses no problem because there is a greater chance that stud 228 will contact all or a significant portion of stripe 208. Again, the reason why such via stud structures are possible is that no etching of dielectric layers takes place.

The concept of fabricating vias having widths which are greater than the width of the underlying conductive stripe has been described previously in the U.S. Pat. No. 3,844,831 in the names of Cass et al. and entitled "Forming A Compact Multi-level Interconnection Metallurgy System for Semiconductor Devices". The aforementioned patent achieves similar structures by providing insulating layers of dissimilar etching characteristics in the adjacent levels of metallurgy. Our technique on the other hand, requires only a single type of insulator with no etching of the insulator being required.

Figure 6A:
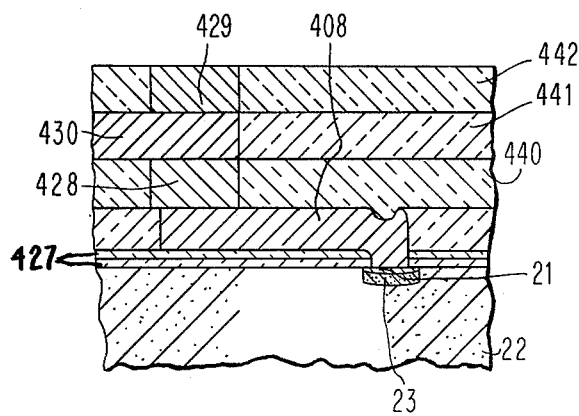
FIGS. 6A and 6 are cross-sectional and top surface views, respectively, illustrating the connection of a first level conductor to a semiconductor region and a pair of coincident feedthroughs.
Figure 6:
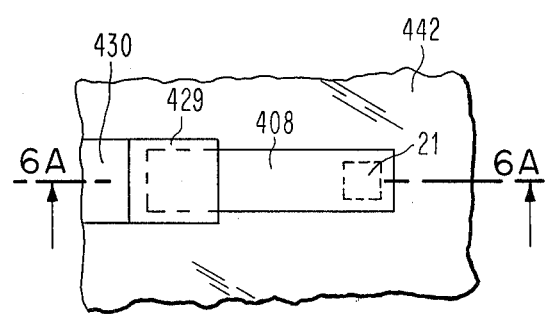

FIGS. 6A and 6 are cross-sectional and top surface views, respectively, which illustrate the connection of a first level conductor 408 to a semiconductor impurity region 23 and a pair of coincident feedthroughs 428 and 429 connected by an intermediate layer 430. Such structures embody substantially all of the principal advantages of our invention.

Although a depression exists in conductor 408 where it connects to contact 21 and semiconductor region 23, this is relatively minor depending on the thickness of insulator 427. A significant area is the upper surface of feedthrough 429, which is coplanar with insulator 442. There are no thin sidewalls where feedthrough 429 contacts insulator 442, as would exist in standard processes.

Although a principal thrust of the invention has been the formation of multiple levels of metallurgy without the necessity for etching dielectric layers, selected levels could be fabricated by conventional etching steps. For example in FIG. 1E there is shown a planar, first level, metal glass insulator layer. Rather than using steps shown in FIGS. 1F–1J to form the via stud, a conventional process could also be used, although it is less desirable. A second dielectric layer could be sputter-deposited or chemically-vapor-deposited atop the planar layer and a via hole etched by conventional techniques atop first metal layer 8. The via contact could then be formed in the aperature, either alone or in combination with a metallic pattern disposed atop the second dielectric layer.

Although the invention has been particularly shown and described with reference to the preferred embodiments thereof, it will be understood by those skilled in the art that the foregoing and other changes in form and details may be made therein without departing from the spirit and scope of the invention.

For example, it has already been mentioned that the insulator may be deposited initially, on top of which is deposited an expendable material. A conductive thin film may then be deposited by the unique RF sputtering step. The same substantially coplanar layer will then be achieved after the removal of the expendable material.

The scope of our invention also includes the fabrication of coplanar conductors, to form waveguides for example, or coplanar dielectrics for optical waveguides.

We claim:

1. A method for fabricating substantially coplanar thin films comprising:
    forming a pattern on a substrate, said pattern including a first thin film and an expendable material disposed on said first thin film;
    depositing a second thin film atop said substrate and said pattern by RF Sputtering at a bias which is sufficiently high to cause substantial reemission of said second thin film, thereby covering the exposed substrate surfaces and the expendable material, but leaving the side surfaces of said expendable material exposed;
    those portions of said second thin film which are deposited atop said substrate being substantially coplanar with said first thin film;
    said expendable material being etchable by an etchant which does not attack either thin film; and
    etching said expendable material with said etchant, thereby removing said expendable material and that portion of the second thin film disposed thereon.

2. A method as in claim 1 wherein said first thin film is a conductor and said second thin film is an insulator.

3. A method as in claim 2 wherein said conductive film is selected from the group consisting of aluminum, aluminum-copper alloys and aluminum-copper-silicon alloys.

4. A method as in claim 3 wherein said expendable material is selected from the group consisting of copper and chrome-copper-chrome composite; and
    said etchant is nitric acid.

5. A method as in claim 2 wherein said conductive film is selected from the group consisting of chrome-silver-chrome composite and tantalum-gold-tantalum composite.

6. A method as in claim 5 wherein said expendable material is aluminum; and
said etchant is potassium hydroxide solution.

7. A method as in claim 1 wherein said first thin film is an insulator and said second thin film is a conductor.

8. A method for fabricating muti-level thin films comprising:
forming a first level pattern on a substrate, said first level pattern including a first thin film and a first expendable material disposed on said first thin film;
depositing a second thin film atop said substrate and said first level pattern by RF sputtering at a bias which is sufficiently high to cause substantial reemission of said second thin film, thereby covering the exposed substrate surfaces and the first expendable material, but leaving the side surfaces of said first expendable material exposed;
those portions of said second thin film which are deposited atop said substrate being substantially coplanar with said first thin film;
said first expendable material being etchable by a first etchant which does not attack either the first or second film; and
etching said first expendable material with said first etchant, thereby removing said first expendable material and that portion of said second thin film disposed thereon and leaving a substantially coplanar first-level pattern of said first and second thin films;
forming a second pattern on said coplanar first-level pattern, said second pattern including a third thin film and a second expendable material disposed on said third thin film;
depositing a fourth thin film atop said coplanar first level pattern and said second pattern by RF sputtering at a bias which is sufficiently high to cause substantial reemission of said fourth film, thereby covering the exposed first level pattern and the second expendable material, but leaving the side surfaces of said second expendable material exposed;
those portions of said fourth thin film which are deposited atop said coplanar first level pattern being substantially coplanar with said third thin film;
said second expendable material being etchable by a second etchant which does not attack either said third or fourth film; and
etching said second expendable material with said second etchant, thereby removing said second expendable material and that portion of said fourth thin film disposed thereon and leaving a substantially coplanar second-level pattern of said third and fourth thin films.

9. A method as in claim 8 wherein said first and third thin films are conductive and said second and fourth thin films are insulators.

10. A method as in claim 9 wherein said second pattern is a feedthrough pattern for connecting said first thin conductive film to one or more succeeding thin film levels.

11. A method as in claim 10 wherein at least one of said conductive films is selected from the group consisting of aluminum, aluminum-copper alloys and aluminum-copper-silicon alloys.

12. A method as in claim 11 wherein at least one of said expendable materials is selected from the group consisting of copper and chrome-copper-chrome composite; and
at least one of said etchants is nitric acid.

13. A method as in claim 10 wherein at least one of said conductive films is selectd from the group consisting of chrome-silver-chrome composite and tantalum-gold-tantalum composite.

14. A method as in claim 13 wherein at least one of said expendable materials is aluminum; and
at least one of said etchants is potassium hydroxide solution.

15. A method as in claim 10 further comprising the steps of:
forming a third pattern on said coplanar second-level pattern, said third pattern including another conductive thin film and a third expendable material disposed on said other film;
at least a portion of said third pattern being connectd to said feedthrough pattern;
depositing another insulating film atop said coplanar second level pattern and said third pattern by RF sputtering at a bias which is sufficiently high to cause substantial reemission of said other insulative film, thereby covering the exposed second level pattern and the third expendable material, but leaving the side surfaces of said third expendable material exposed;
those portions of said another insulating film which are deposited atop said second level coplanar pattern being substantially coplanar with said another conductive film;
said third expendable material being etchable by a third etchant which does not attack either of said other films; and
etching said third expendable material with said third etchant, thereby removing said third expendable material and that portion of said another insulator deposited thereon and leaving a substantially coplanar third level pattern of said other conductive and insulative films.

16. A method as in claim 15 wherein at least one of said conductive films is selected from the group consisting of aluminum, aluminum-copper alloys and aluminum-copper-silicon alloys.

17. A method as in claim 16 wherein at least one of said expendable materials is selected from the group consisting of copper and chrome-copper-chrome composite; and
at least one of said etchants is nitric acid.

18. A method as in claim 15 wherein at least one of said conductive films is selected from the group consisting of chrome-silver-chrome composite and tantalum-gold-tantalum composite.

19. A method as in claim 18 wherein at least one of said expendable materials is aluminum; and
at least one of said etchants is KOH.

20. A method as in claim 8 wherein said first and third thin films are insulators and said second and fourth thin films are conductive.

21. A method as in claim 8 wherein said substrate includes one or more substantially coplanar patterns of thin films.

* * * * *